United States Patent [19]

Yurtin

[11] 3,999,826

[45] Dec. 28, 1976

[54] CONNECTOR FOR FLEXIBLE PRINTED CIRCUIT

[75] Inventor: John A. Yurtin, Southington, Ohio

[73] Assignee: General Motors Corporation, Detroit, Mich.

[22] Filed: June 30, 1975

[21] Appl. No.: 591,279

[52] U.S. Cl. ........................ 339/17 F; 339/176 MF

[51] Int. Cl.² .................... H01R 13/50; H05K 1/12

[58] Field of Search ......... 339/17 F, 176 MF, 99 R

[56] References Cited

UNITED STATES PATENTS

| | | | |
|---|---|---|---|
| 3,221,096 | 11/1965 | Croghan | 339/176 MF |
| 3,350,530 | 10/1967 | Fry | 339/17 F |
| 3,365,695 | 1/1968 | Harvey et al. | 339/99 R |
| 3,477,059 | 11/1969 | Cole | 339/17 F |
| 3,613,049 | 10/1971 | Niedzwiecki | 339/176 MF |
| 3,641,482 | 2/1972 | Bretting | 339/17 F |
| 3,820,058 | 6/1974 | Friend | 339/176 MF |

*Primary Examiner*—Roy Lake
*Assistant Examiner*—Neil Abrams
*Attorney, Agent, or Firm*—F. J. Fodale

[57] ABSTRACT

A unitary housing of moldable dielectric material having a body portion, a cover portion, and an interconnecting hinge portion is clamped onto a terminal portion of the flexible printed circuit having a plurality of uninsulated, cantilevered conductor strip end portions. The body portion of the housing has open ended cavities. Terminals are disposed in the cavities in biased engagement with portions of the conductor strip end portions wiped into the cavities by the terminals. The cover portion is movable between an open position providing access to the cavities for assembly of the terminals and a closed position for clamped engagement with the terminal portion of the flexible printed circuit. The terminal cavities may be in an irregular pattern and may include a part cylindrical surface to facilitate the conductor strip end portions being wiped into the cavities by the terminals. The cover portion may be releasably or permanently retained in the closed position and may include rounded projections aligned with the cavities and in biased engagement with the terminals disposed therein.

9 Claims, 5 Drawing Figures

CONNECTOR FOR FLEXIBLE PRINTED CIRCUIT

This invention relates generally to electrical connectors and more specifically to electrical connectors for flexible printed circuits.

Flexible printed circuits comprise a plurality of thin flat conductor strips of copper, or other suitable metal or alloy having high flexibility, and good electric conductivity. The conductor strips are insulated and maintained in a predetermined pattern usually by generally flexible flat sheets of dielectric material, such as a polyester of a few thousands inches in thickness, which are bonded together enclosing the conductor strips.

It is known from the U.S. Pat. No. 3,365,694 issued to George W. Parker on Jan. 23, 1968 for a Connector Means to make an electrical connection between terminals of electrical leads and the terminal portion of a flexible printed circuit by wiping uninsulated end portions of the conductor strips down into a perpendicular panel cavity upon insertion of a plurality of terminals carried by a separate plug body into the cavity.

It is also known from the U.S. Pat. No. 3,641,482 issued to Klaus Bretting on Feb. 8, 1972 for a Plug Connector for Flat Conduct Strip Line to provide a unitary housing of moldable dielectric material which clamps on the terminal portion of a flexible printed circuit and holds terminals which are welded to the uninsulated end faces of the conductor strips at the end of the flexible printed circuit.

In one of its broadest aspects, the object of this invention is to provide a unitary housing of moldable dielectric material adapted to clamp onto the terminal portion of the flexible printed circuit and hold the terminals electrically connected to uninsulated conductor strips of the flexible printed circuit by a simple wiped engagement.

Another object of this invention is to provide a housing in accordance with the preceding object which protects the uninsulated portions of the flexible printed circuit which are necessary for a wipe in electrical connection.

Another object of this invention is to provide a housing in accordance with the preceding object which may accommodate an irregular arrangement of terminals and conductor strips in the terminal portion of the flexible printed circuit.

Yet another object of this invention is to provide a unitary housing for firm mechanical attachment to a terminal portion of a flexible printed circuit and for holding a terminal in wiped engagement with uninsulated conductor strips of the flexible printed circuit for plugged engagement with mating terminals of an electrical device.

In another of its broadest aspects the object of this invention is to provide an electrical connector for a flexible printed circuit comprising a housing in accordance with any of the preceding objects and terminals which wipe in conductor strips of the printed circuit in one part of the housing and are retained therein independently of the clamping engagement of the printed circuit.

Another object of this invention is to provide an electrical connector in accordance with any of the preceding objects in which the electrical connection between the terminals and the conductor strips is improved simultaneously with the clamping engagement of the housing with the terminal portion of the flexible printed circuit.

Still another object of this invention is to provide an electrical connector for a flexible printed circuit which clamps onto a terminal portion thereof and which carries terminals electrically connected to the terminal portion of the flexible printed circuit by a simple biased engagement without the necessity of brazed, welded or other similar bonding, and in which the terminals may be placed in an irregular pattern.

Other objects and features of the invention will become apparent to those skilled in the art as the disclosure is made in the following detailed description of a preferred embodiment of the invention as illustrated in the accompanying sheets of drawing in which.

Figure 1:
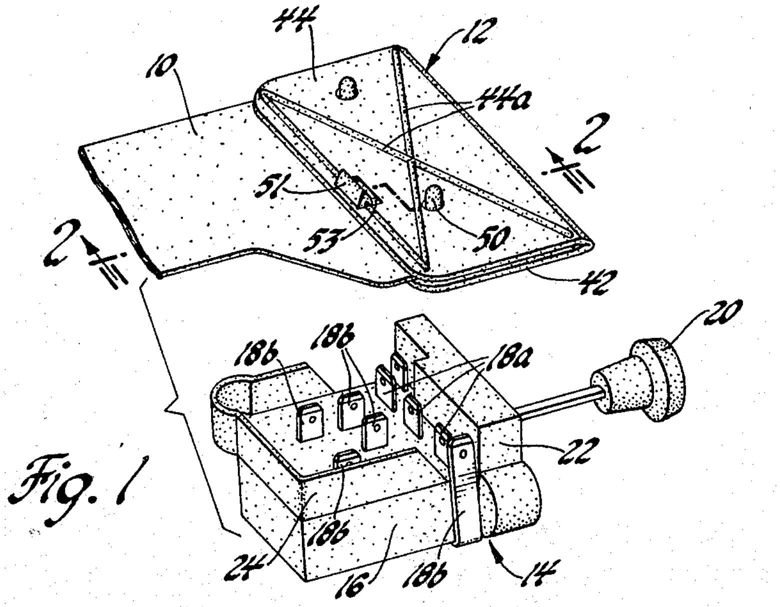
FIG. 1 is a perspective view of a flexible printed circuit provided with a connector in accordance with this invention which connector is in the process of being connected to an automotive light switch.

Referring now to the drawing, FIG. 1 shows a flexible printed circuit 10 which has a connector generally indicated at 12 attached to one end. The connector 12 connects a number of conductor strips of the flexible printed circuit to an electrical device such as the automotive light switch 14 through mating terminals arranged in corresponding patterns.

The light switch 14 comprises a housing 16 with a plurality of protruding male terminals **18*a* and 18*b* which are disposed in an irregular pattern. More specifically, the terminals 18*a* and 18*b* are somewhat scattered about with the terminals 18*a* oriented widthwise of the body 16 and the terminals 18*b* oriented perpendicularly thereto or lengthwise of the body. Moreover, the terminals 18*a* and 18*b* are both in more than one row. The switch also includes a manual operator 20 which interconnects various ones of the terminals 18*a* and 18*b* responsive to the linear and rotative movements of the manual operator 20 to activate lights at various locations on the automobile. The switch body 16 further includes a forward flange 22 and a generally U-shaped wall 24 which cooperatively form a cavity for receiving a depending boss like portion of the connector 12 shown in FIGS. 2 and 3**.

Figure 5:
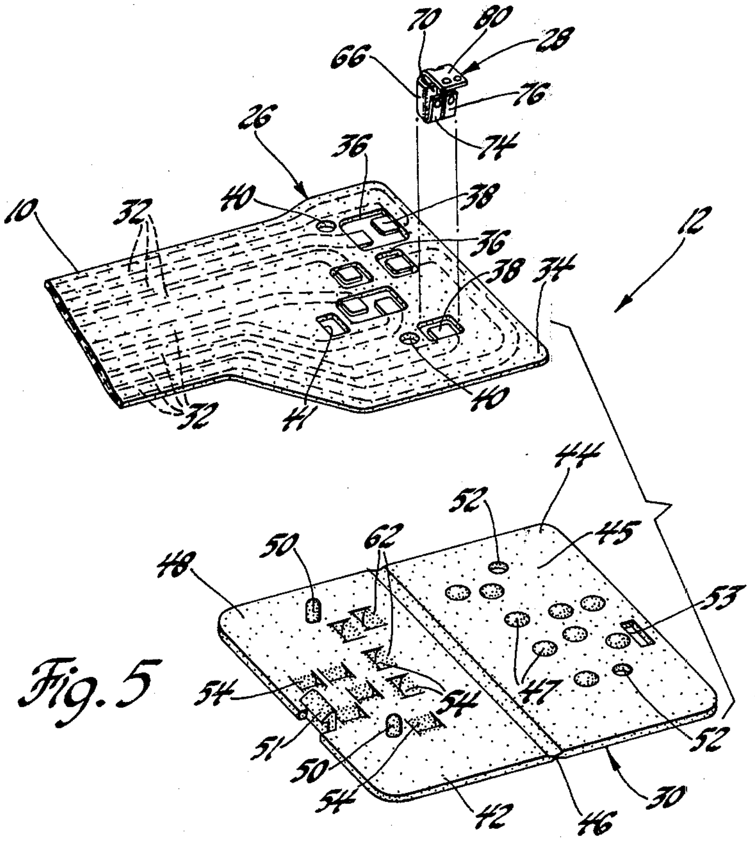
FIG. 5 is an exploded perspective view of the connector shown in FIG. 1.

Referring now to FIG. 5 the connector 12 cooperates with a terminal portion 26 of the flexible printed circuit 10, and comprises a plurality of female terminals 28 (only one shown in FIG. 5) and a unitary housing 30 of moldable dielectric material.

The flexible printed circuit 10 comprises a plurality of thin flat conductor strips 32 of copper or other suitable metal or alloy having high flexibility and good electrical conductivity. The strips 32 are insulated and maintain in a predetermined pattern by generally flexible flat sheets of dielectric material such as a polyester of a few thousands inches in thickness. The polyester sheets 34 are bonded together enclosing the conductor strips 32 and appear as a unitary sheet with the conductor strips embedded therein.

The terminal portion 26 of the flexible printed circuit 10 is enlarged and has a plurality of holes 36 through the bonded polyester sheets 34 which expose end portions 38 of the various conductor strips 32. The exposed end portions 38 have an irregular pattern corresponding to the irregular pattern of the male terminals 18 with some of the end portions being parallel to the length of the flexible printed circuit 12 and other of the end portions being parallel to the width of the flexible printed circuit. The terminal portion 26 also includes two polarizing holes 40 and a latch arm passage 41, all of which are spaced from the conductor strips 32.

Figure 3:
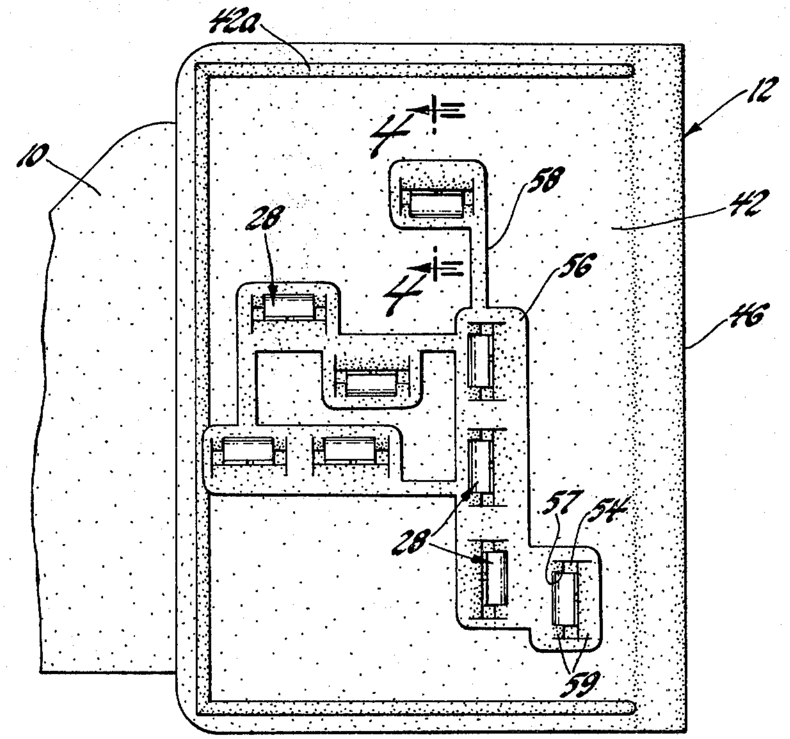
FIG. 3 is a bottom view of the flexible printed circuit and connector taken along the line 3—3 of FIG. 2.

The housing 30 comprises a body portion 42, a cover portion 44, and a flexible hinge portion 46 of reduced thickness connecting the two parts (see FIG. 3 also). The upper surface 48 of the body portion 42 is substantially flat and has two polarizing posts 50 and an upstanding latch arm 51 adjacent the edge opposite the hinge portion 46. The polarizing posts 50 cooperate with the polarizing holes 40 to correctly position the terminal portion 26 of the flexible printed circuit 10 and also cooperate with mating holes 52 extending through the cover 44. The latch arm 51 fits through the latch arm passage 41 of the flexible printed circuit and snaps through a slot 53 in the cover portion 44 to retain it in the closed position.

The body portion 48 has a plurality of spaced generally rectangular terminal receiving cavities 54 which extend perpendicularly through the body portion 48 from the upper flat surface 48 to a lower surface 56 of a depending boss like portion 58 which defines the lower portions of the cavities 54 and which fits into the cavity of the switch 14.

The cavities 54 are arranged in an irregular pattern corresponding to that of the conductor strip end portions 38 and the male terminals 18 of the switch 14. Each of the cavities has a side wall 60 which preferably includes an upper part cylindrical surface 62 which merges smoothly with the flat upper surface 48 of the body portion 42 of the housing 30. As best seen in FIG. 5, the part-cylindrical surface 62 are arranged so that the end portions 38 of the conductor strips 32 project over them when the terminal portion 26 of the flexible printed circuit 10 is placed on top of the surface 48 in the proper position determined by the polarizing holes 40 and posts 50.

The cover 44 has a generally planar surface 45 engaging the terminal porton 26 of the flexible printed circuit 10, and preferably includes a plurality of rounded projections 47 which align respectively with the cavities 54 when the cover is in the closed position.

As mentioned previously the housing is a unitary part of moldable dielectric material. Preferably the housing is formed from relatively rigid plastic such as a fiber filled polypropylene. The hinge portion is flexible because of its reduced thickness. If desired, rigidity may be added to the body portion 42 by a U-shaped stiffening rib 42*a* and to the cover portion 44 by diagonal stiffening ribs 44*a*.

Figure 4:
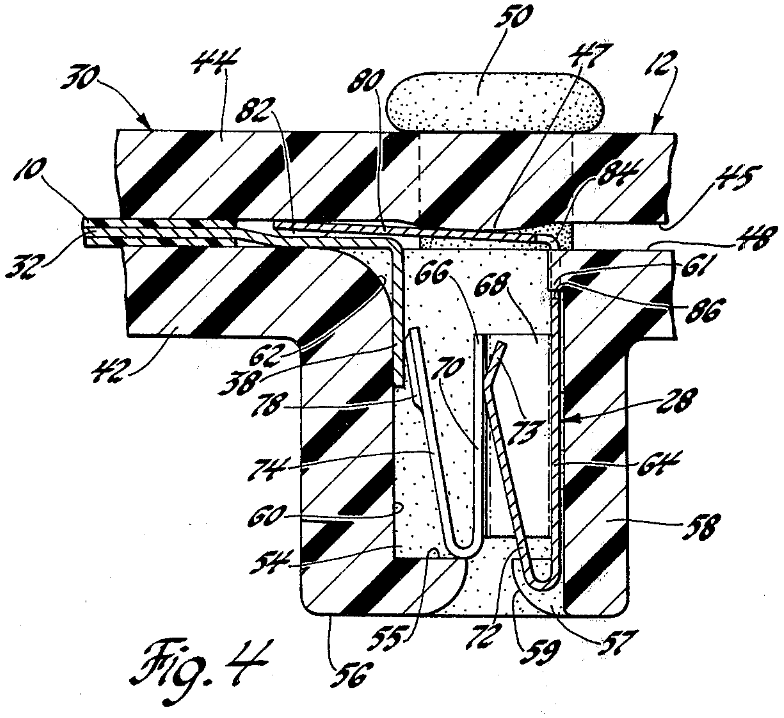
FIG. 4 is a section taken along the line 4—4 of FIG. 3.

The female terminal 28 shown in FIGS. 4 and 5 is typical of the plurality of female terminals which are used in the connector 12. The female terminal 28 per se is the subject of my copending application Ser. No. 559,030 entitled "Wipe-In Female Terminal for Printed Circuits" filed Mar. 17, 1975 and assigned to the assignee of this invention.

Briefly, the female terminal 28 which is of unitary sheet metal construction comprises a generally planar body portion 64 having an intermediate box-like portion 66. The box-like portion 66 includes side walls 68 contiguous respectively with laterally spaced sides of the body portion 64 which side walls 68 have inturned lateral flanges 70 at their free ends. The inturned lateral flanges 70 are substantially coplanar and may have a spacing therebetween. A first resilient inclined tongue 72 is connected to the forward end of body portion 64 by a reverse bend from whence the tongue 72 extends upwardly and rearwardly into the interior of the box-like portion 66 where it terminates in a downwardly bent lip portion 73. Thus the tongue 72 is adapted to bias a male terminal received in the box-like portion 66 into engagement with the interior surfaces of the inturned flanges 70. Second and third identical resilient inclined tongues 74 and 76 are respectively connected to the forward end of the inturned flanges 70 by reverse bends from which these tongues extend rearwardly and upwardly. The tongues 74 and 76 disposed outwardly of the box-like portion 66 preferably have raised areas, such as the outwardly projecting flat dimples 78, adjacent their free ends for establishing electrical contact with the end portion 38 of the conductor strips which is wiped into the cavity 54.

The female terminal 28 further includes a transverse portion 80 connected to the rearward end of the body portion 64. The transverse portion 80 extends outwardly of the resilient tongues 74 and 76 and also preferably has a pair of spaced raised areas, such as the forwardly projecting flat dimples 82, for establishing electrical contact with the conductor strips 38 at locations spaced fron the cavity 54. A longitudinal slot 84 in the body portion 64 extends from the rearward end of the body portion (and through the transverse portion 80) forwardly terminating at a rearwardly facing latch edge 86.

Focussing now on FIG. 5, the connector 12 is assembled to the flexible printed circuit in the following manner. With the cover 44 in the open position, the terminal portion 26 of the flexible printed circuit 10 is placed on top of the surface 48 with the polarizing posts 50 being received in the holes 40 to properly position terminal portion 26 so that each end portion 38 overhangs one of the cavities 54. The female terminal 28 is then attached to the body portion 42 by inserting the female terminal 28 forward end first into the cavity 54 through the opening at the surface 48. During insertion the tongues 74 and 76 contact the end portion 38 of the conductor strip 32 and wipe it down into the cavity 54. Over-insertion of the terminal 28 is prevented by the front ends of the tongues 74 and 76 engaging an internal shoulder 55 in the cavity. The cavities 54 also have lower corner abutments 57 at their lower openings which laterally position the forward end of the terminal in cooperation with the forward end of the body portion 64. Curved external surfaces 59 are provided at the lower cavity openings for guiding male terminals into the box-like portion of the female terminal 28. The terminal 28 is retained in the cavity 54 by the latch edge 86 engaging a cooperating latch shoulder 61 protruding into the cavity 54.

In the assembled position, the transverse portion 80 of the female terminal 28 is biased into engagement with the conductor strip 38 at a location spaced laterally from the cavity 54 thus providing additional electrical contact; the electrical contact preferably being established by forwardly projecting dimples 82 to improve the electrical connection to the printed circuit.

In a like manner a female terminal is inserted into each of the cavities 54 establishing electrical contact with an associated conductor end portion 38 by wiping the same into its associated cavity. When all of the terminals have been assembled to the body portion 42 of the housing 30, the cover portion 44 is pivoted about the hinge portion 46 from the open position shown in FIG. 5 and in phantom in FIG. 2 to the closed position shown in solid lines in FIG. 2. In the closed position the terminal portion 26 of the flexible printed circuit is firmly clamped between the body portion 42 and cover portion 44 of the housing 30 and all the uninsulated end portions 38 of the conductor strips 32 are completely covered and protected. The rounded projections 47 of the cover 44 biasingly engage the transverse portions 80 of the terminals 28 firmly seating the terminals 28 in the cavities 54 and biasing the dimples 82 into engagement with the end portions 38 of the conductor strips 32 at locations spaced from the cavities 54 thus assuring good electrical contact. The cover portion 44 is retained in the closed position by engagement of the hooked end of the latch arm 51 with the portion of the cover portion 44 between the slot 53 and the edge opposite the hinge portion 46. Additional retention of the cover in the closed position may be provided by cold heading or heat staking the portions of the polarizing posts 50 protruding through the cover portion 44.

Figure 2:
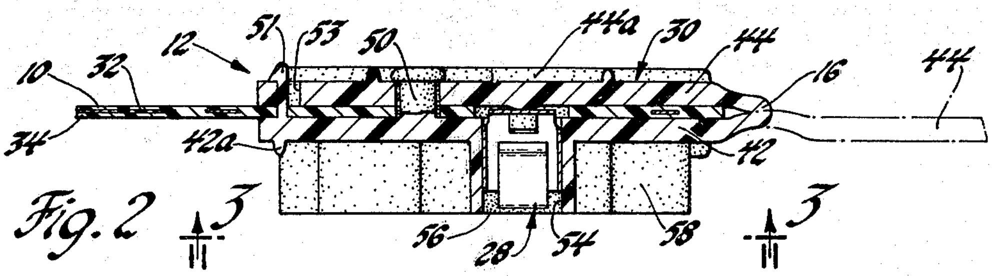
FIG. 2 is a section of the flexible printed circuit and connector along the line 2—2 of FIG. 1.

The connector 12 firmly attached to the end of the flexible printed circuit is shown in FIGS. 1, 2 and 3. The connector 12 is connected to the light switch 14 or other electrical device simply by plugging the male terminals into the mating female terminal 28 via the lower openings of the cavities 54 which are arranged in a complementary pattern.

While for the purpose of disclosure, the connector 12 has been described as having female terminals matable with male terminals of a particular electrical device, an automotive light switch, it is to be understood that male terminals might be used in the connector 12 for connection to female terminals of another electrical device, and that connections may be made to any type of electrical device within the spirit and scope of this invention. In other words, it is not intended to be limited to the exact details of the device described herein as obvious modifications within the spirit and scope of the invention will appear to those skilled in the art.

What is claimed is:

1. A unitary housing, of moldable dielectric material for connecting terminals to a flexible printed circuit comprising:

a body portion having a substantially flat upper surface and a plurality of spaced generally rectangular terminal-receiving cavities extending therethrough perpendicularly to said substantially flat upper surface, said cavities having first openings at said substantially flat upper surface for inserting terminals into said cavities and second aligned openings at a lower surface of said body portion, each of said cavities having a side wall merging with said substantially flat upper surface of said body portion for wiping overhanging conductor strips of a terminal portion of a flexible printed circuit engaging said substantially flat upper surface into said cavities in cooperation with terminals upon insertion thereof into said cavities through said first openings;

a cover portion connected to said insulator body portion by a flexible hinge portion, said cover portion having a generally planar surface and being pivotally movable about said flexible hinge portion between a closed position whereat said planar surface of said cover portion overlies said substantially flat upper surface of said insulator body portion substantially parallel and in close proximity thereto for cooperative clamping engagement of a terminal portion of a flexible printed circuit, and an open position for providing access to said first openings of said cavities for insertion of terminals thereinto, means for retaining terminals in said cavities independently of the position of said cover, and means for retaining said cover portion in the closed position.

2. The unitary housing as defined in claim 1 wherein said cavities are disposed in an irregular pattern.

3. A unitary housing, of moldable dielectric material for connecting terminals to a flexible printed circuit comprising:

a body portion having a substantially flat upper surface and a plurality of spaced generally rectangular terminal-receiving cavities extending therethrough perpendicularly to said substantially flat upper surface, said cavities being disposed in an irregular pattern and having first openings at said substantially flat upper surface for inserting terminals into said cavities and second aligned openings at a lower surface of said body portion, each of said cavities having a side wall having an upper part cylindrical surface merging smoothly with said substantially flat upper surface of said body portion for wiping overhanging conductor strips of a terminal portion of a flexible printed circuit engaging said substantially flat upper surface into said cavities in cooperation with female terminals upon insertion thereof into said cavities through said first openings;

a cover portion connected to said insulator body portion by a flexible hinge portion, said cover portion having a generally planar surface and being movable between a closed position whereat said planar surface of said cover portion overlies said substantially flat upper surface of said insulator body portion substantially parallel and in close proximity thereto for cooperative clamping engagement of a terminal portion of a flexible printed circuit, and an open position for providing access to said first openings of said cavities for insertion of terminals thereinto, said planar surface of said cover portion having a plurality of projections aligned with respective ones of said plurality of cavities when said cover portion is in the closed position for biasing terminals disposed in said cavities downwardly;

and means for retaining said cover portion in the closed position.

4. The unitary housing as defined in claim 3 wherein said means for retaining said cover portion in the closed position comprises permanently deformed portions of polarizing posts of said body portion projecting through apertures of said cover portion.

5. A connector for a flexible printed circuit comprising a terminal portion of the flexible printed circuit having a plurality of uninsulated, cantilevered conductor strip end portions, a unitary housing of moldable dielectric material having a body portion, a cover portion and an interconnecting hinge portion, said body portion having a surface supporting said terminal portion and a plurality of terminal-receiving cavities extending therethrough, said cavities having first openings at said surface and second aligned openings at an opposite surface of said body portion, terminals disposed in said cavities in biased engagement with portions of said conductor strip end portions disposed therein, means retaining said terminals in said cavities of said body portion independently of the position of said cover portion, said cover portion having a surface in clamped engagement with said terminal portion of the flexible printed circuit in a closed position, said cover portion being pivotally movable about said interconnecting hinge portion to said closed position from an open position providing access to said first openings of said cavities for insertion of said terminals thereinto, and means integral with said housing for securing said cover portion in the closed position.

6. A connector for a flexible printed circuit comprising a terminal portion of the flexible printed circuit having a plurality of uninsulated, cantilevered conductor strip end portions, a unitary housing of moldable dielectric material having a body portion, a cover portion and an interconnecting hinge portion, said body portion having a substantially flat upper surface for supporting said terminal portion and a plurality of spaced generally rectangular terminal-receiving cavities extending therethrough perpendicularly to said substantially flat upper surface, said cavities having first openings at said substantially flat upper surface and second aligned openings at a lower surface of said body portion, terminals disposed in said cavities in biased engagement with portions of said conductor strip end portion disposed therein, said terminals having transverse portions engaging said conductor strip end portions at locations spaced from said cavities, said cover portion having a generally planar surface overlying said substantially flat upper surface of said body portion substantially parallel and in close proximity thereto and in clamped engagement with said terminal portion of the flexible printed circuit in a closed position, said generally planar surface having a plurality of rounded projections engaging said transverse portions of said terminals when said cover portion is in said closed position, said cover portion being movable to said closed position from an open position providing access to said first openings of said cavities for insertion of terminals thereinto, and means integral with said housing for securing said cover portion in the closed position.

7. The connector as defined in claim 6 wherein each of said cavities have a side wall having an upper part cylindrical surface merging smoothly with said substantially flat upper surface of said body portion and wherein said portion of said conductor strip end portions are disposed in said cavities adjacent said side wall.

8. The connector as defined in claim 7 wherein said cavities are disposed in an irregular pattern.

9. The connector as defined in claim 8 wherein said means integral with said housing for securing said cover in the closed position includes releasable retention means and permanent retention means comprising permanently deformed portions of polarizing posts of said body portion projecting through apertures of said cover portion.

* * * * *